(12) United States Patent
Inoue et al.

(10) Patent No.: US 12,050,238 B2
(45) Date of Patent: Jul. 30, 2024

(54) MEASUREMENT DEVICE, MEASUREMENT DEVICE CONTROL METHOD, AND MEASUREMENT DEVICE CONTROL PROGRAM

(71) Applicant: INFORMETIS CORPORATION, Tokyo (JP)

(72) Inventors: Yasuhiko Inoue, Tokyo (JP); Tomoyuki Ono, Tokyo (JP)

(73) Assignee: Informetis Corporation, Tokyo (JP)

( * ) Notice: Subject to any disclaimer, the term of this patent is extended or adjusted under 35 U.S.C. 154(b) by 33 days.

(21) Appl. No.: 17/967,134

(22) Filed: Oct. 17, 2022

(65) Prior Publication Data

US 2023/0039083 A1    Feb. 9, 2023

Related U.S. Application Data

(63) Continuation of application No. PCT/JP2021/012013, filed on Mar. 23, 2021.

(30) Foreign Application Priority Data

Apr. 17, 2020    (JP) .................. 2020-074379

(51) Int. Cl.
   *G01R 25/00*    (2006.01)
(52) U.S. Cl.
   CPC .................. *G01R 25/00* (2013.01)
(58) Field of Classification Search
   CPC ..... G01R 25/00; G01R 29/18; G01R 19/2513
   (Continued)

(56) References Cited

U.S. PATENT DOCUMENTS

| 11,054,456 B2 * | 7/2021 | Dale ............... G06Q 50/06 |
| 11,293,955 B2 * | 4/2022 | Cook ............... G01R 21/133 |

(Continued)

FOREIGN PATENT DOCUMENTS

| EP | 3 252 907 | 12/2017 |
| EP | 3 252 908 A1 | 12/2017 |

(Continued)

OTHER PUBLICATIONS

Notice of Reasons for Refusal dated Feb. 6, 2024, of counterpart Japanese Patent Application No. 2020-074379, along with an English translation.

(Continued)

*Primary Examiner* — Giovanni Astacio-Oquendo
(74) *Attorney, Agent, or Firm* — DLA Piper LLP (US)

(57) ABSTRACT

A measurement system includes: a first voltage measurement unit, which measures a first voltage as a line voltage between first and second phases of a three-phase power line configured by three phases including the first, second, and a third phase; a first current measurement unit, which measures a first current as a current of the first phase; a third current measurement unit, which measures a third current as a current of the third phase; a determination unit, which determines a direction of rotation of the three phases based on the first voltage and the first current; and a computation unit which, based on at least the determination of the direction of rotation by the determination unit, computes a change in a current phase due to a load device in each of the first, third, and a second current as a current of the second phase.

9 Claims, 14 Drawing Sheets

(58) Field of Classification Search
USPC .................................. 324/86, 76.11, 76.52
See application file for complete search history.

(56) References Cited

U.S. PATENT DOCUMENTS

| | | | |
|---|---|---|---|
| 2014/0343878 A1* | 11/2014 | Gudmundsson ... | G01R 29/0814 702/64 |
| 2016/0033568 A1 | 2/2016 | Tsao et al. | |
| 2016/0091542 A1* | 3/2016 | Kitajima ................ | G01R 29/18 702/60 |
| 2016/0349311 A1 | 12/2016 | Hayashi et al. | |
| 2019/0012604 A1 | 1/2019 | Hiratsuka et al. | |
| 2019/0079117 A1 | 3/2019 | Hurwitz et al. | |
| 2019/0086461 A1* | 3/2019 | Dale .................... | G01R 21/133 |
| 2021/0063453 A1* | 3/2021 | Ferguson .......... | H02J 13/00002 |

FOREIGN PATENT DOCUMENTS

| | | |
|---|---|---|
| JP | S62-162977 A | 7/1987 |
| JP | H3-99370 U1 | 10/1991 |
| JP | 2000-74959 A | 3/2000 |
| JP | 2001-124806 A | 5/2001 |
| JP | 2004-38765 A | 2/2004 |
| JP | 2007-212266 A | 8/2007 |
| JP | 2011-072122 A | 4/2011 |
| JP | 2016-75587 A | 5/2016 |
| JP | 2018-4330 A | 1/2018 |
| JP | 2019-053342 A | 4/2019 |
| WO | 2016/121378 A1 | 8/2016 |

OTHER PUBLICATIONS

Extended European Search Report dated Apr. 23, 2024, of counterpart European Patent Application No. 21789214.0.

* cited by examiner

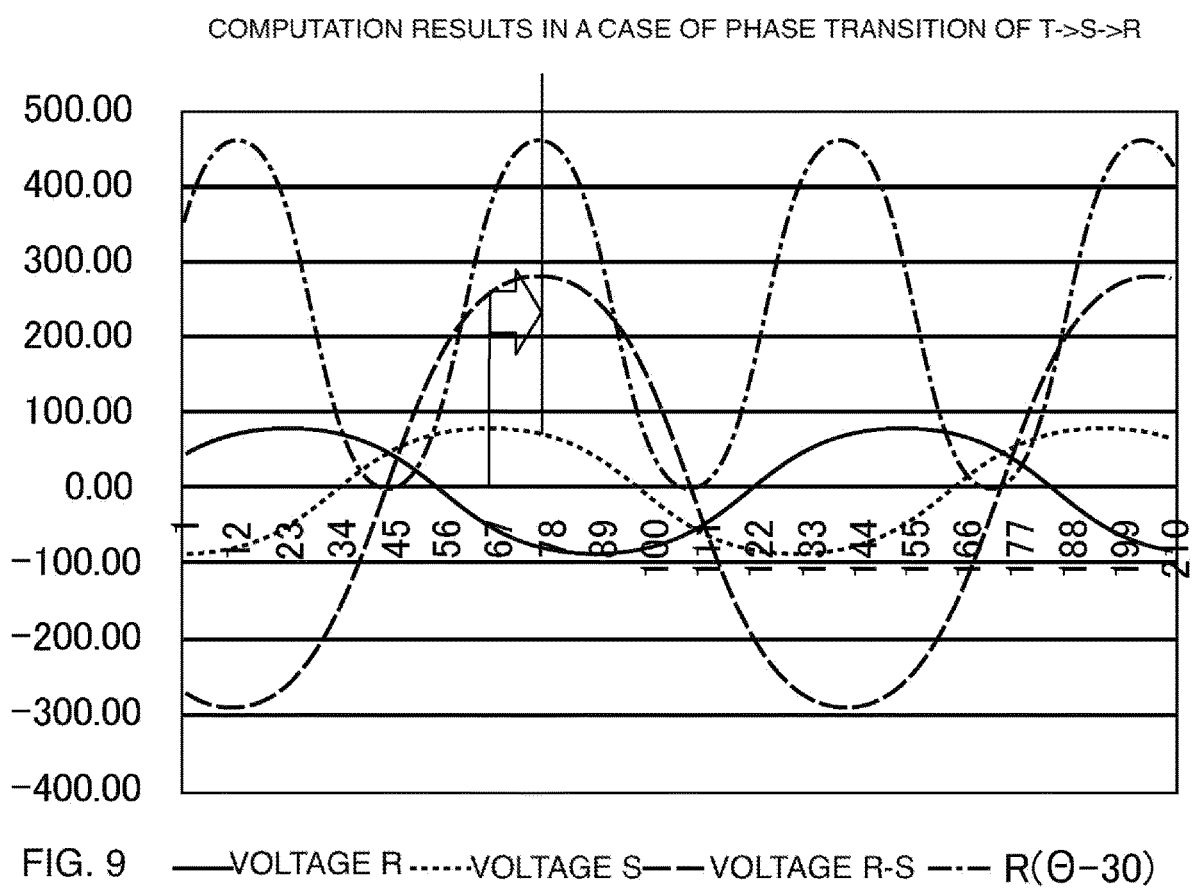
FIG. 9 —VOLTAGE R ·····VOLTAGE S — —VOLTAGE R-S – – – R(Θ−30)

MEASURE NORMAL PHASE USING VOLTAGE PHASE RS AS REFERENCE
FIG. 13A
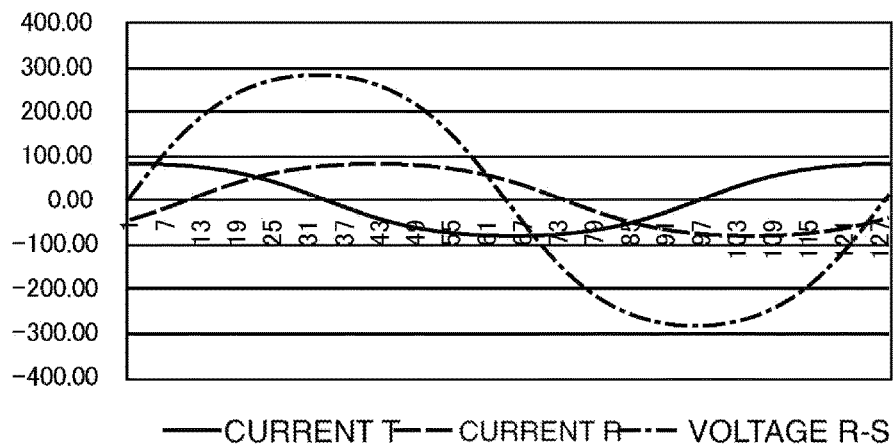
WAVEFORM OBSERVED WHEN CT MEASURING PHASE T IS ATTACHED TO PHASE S
FIG. 13B
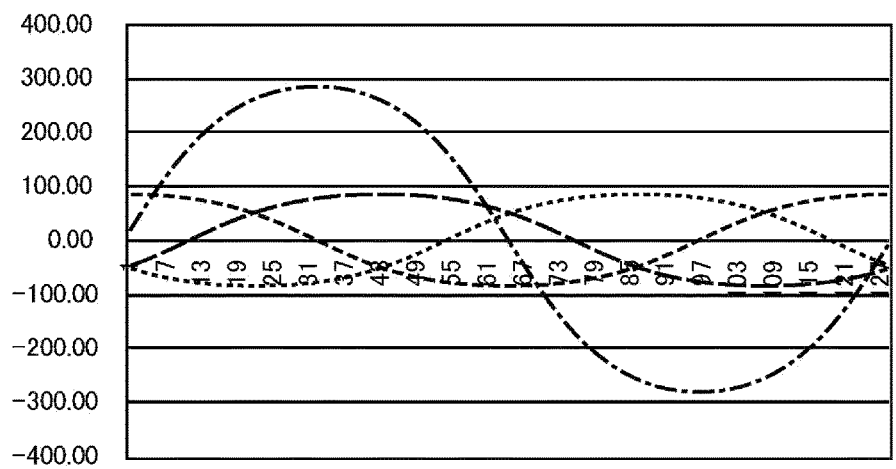

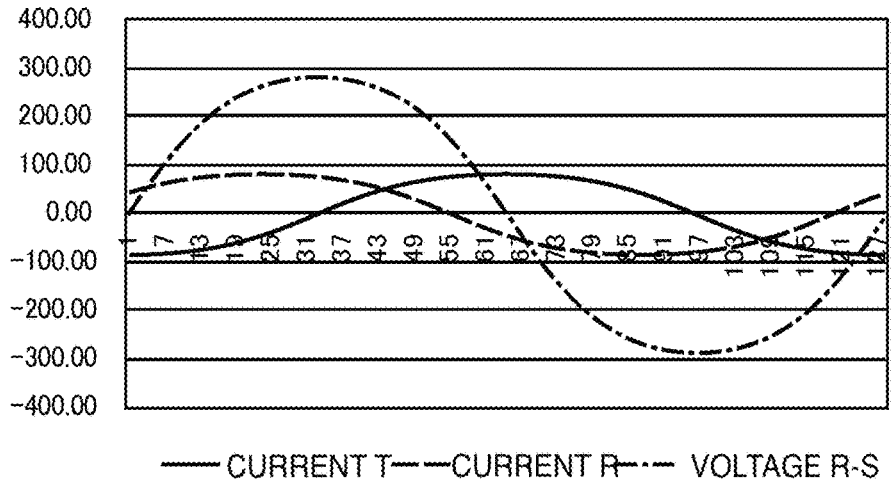
FIG. 14A
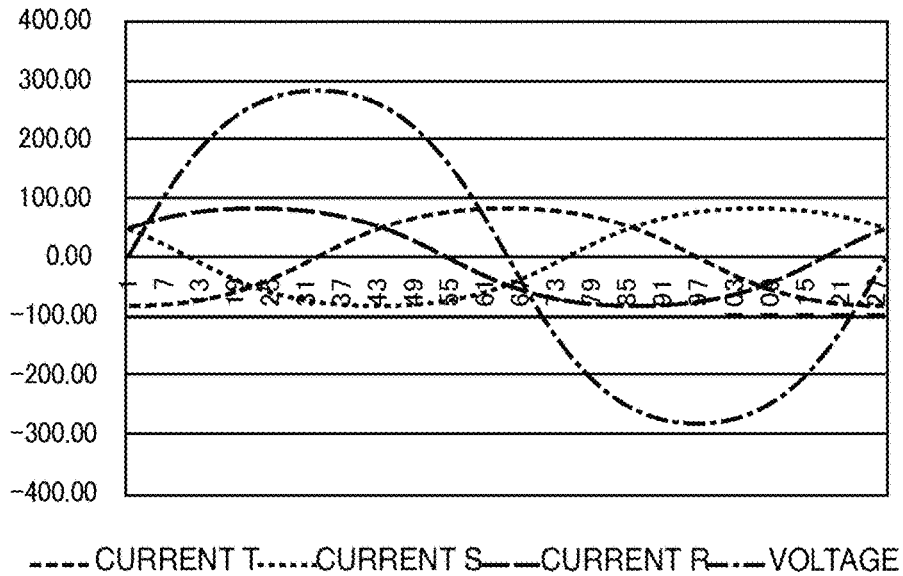
FIG. 14B

MEASUREMENT DEVICE, MEASUREMENT DEVICE CONTROL METHOD, AND MEASUREMENT DEVICE CONTROL PROGRAM

TECHNICAL FIELD

This disclosure relates to a measurement system, measurement system control method, and measurement system control program.

BACKGROUND

A technology that measures a waveform of current flowing in a power supply, and analyzes each of the currents flowing in the electrical devices as a load separately is known. For example, Japanese Laid-Open Patent Publication No. 2019-053342 discloses a model identification system that acquires device information to identify the model of an electric device, extracts current waveform data for a certain operating interval, extracts parameters used to identify the electric device, and identifies the model of the electric device.

A measurement technique using the two-wattmeter method in which two wattmeters measure three-phase power has been also developed. For example, Japanese Laid-Open Patent Publication No. 2011-072122 discloses a technique for determining the operating state of the power supply using the two-wattmeter method.

However, to analyze the current waveforms flowing to the electric devices in a three-phase power supply, the voltage and current need to be measured in each of the three phases and compute the change in the current phase due to the loading device with respect to the voltage phase. Therefore, in the three-phase power supply, the installation of sensors to measure voltage and current for the three phases could increase the costs of the devices.

In addition, since the direction of rotation of the three-phase power supply cannot be determined in the two-wattmeter method, two wattmeters are installed in the direction opposite to the rotation direction of the three-phase power supply when the rotation direction of the three-phase power supply is unknown, causing the measurement to be incorrect.

It could therefore be helpful to provide a measurement system, a measurement system control method, and a measurement system control program capable of computing the change in current phase for three phases at low cost, even when the direction of rotation of three-phase power is unknown.

SUMMARY

We thus provide:

(1) A measurement system that may include: a first voltage measurement unit, which measures a first voltage as a line voltage between a first phase and a second phase of a three-phase power line configured by three phases including the first phase, the second phase, and a third phase; a first current measurement unit, which measures a first current as a current of the first phase; a third current measurement unit, which measures a third current as a current of the third phase; a determination unit, which determines a direction of rotation of the three phases on the basis of the first voltage and the first current; and a computation unit which, on the basis of at least the determination of the direction of rotation by the determination unit, computes a change in a current phase due to a load device in each of the first current, the third current, and a second current as a current of the second phase.

(2) The measurement system may further include: a second voltage measurement unit, which measures a second voltage as a line voltage between the second phase and the third phase; and a verification unit, which verifies the direction of rotation of the three phases determined by the determination unit on the basis of the second voltage and the third current.

(3) The determination unit may determine an installation error of the third current measurement unit on the basis of a result of the verification of the direction of rotation. The determination unit may determine the direction of rotation of the three phases on the basis of a phase difference between the first voltage and the first current.

(4) An installation error of the third current measurement unit may be determined on the basis of a result of the verification of the direction of rotation.

(5) The determination unit may determine the direction of rotation of the three phases on the basis of whether a phase of the first voltage is ahead of a phase of the first current or behind the phase of the first current.

(6) The determination unit may determine the direction of rotation of the three phases on the basis of a power value computed from the first voltage and the first current.

(7) The determination unit may compute a first power value computed from the first voltage and the first current with the phase advanced, and a second power value computed from the first voltage and the first current with the phase delayed, and determine the direction of rotation of the three phases on the basis of a comparison of magnitudes of the first power value and the second power value.

(8) A measurement system control method of controlling a measurement system may include the steps of: measuring a first voltage as a line voltage between a first phase and a second phase of a three-phase power line configured by three phases including the first phase, the second phase, and a third phase; measuring a first current as a current of the first phase; determining a direction of rotation of the three phases on the basis of the first voltage and the first current; and computing a shift of a phase of the first current on the basis of the determination of the direction of rotation in the determining step.

(9) A measurement system control program causes a measurement system to embody the functions of: measuring a first voltage as a line voltage between a first phase and a second phase of a three-phase power line configured by three phases including the first phase, the second phase, and a third phase; measuring a first current as a current of the first phase; determining a direction of rotation of the three phases on the basis of the first voltage and the first current; and computing a shift of a phase of the first current on the basis of the determination of the direction of rotation in the determining function.

Our method measures a first voltage as a line voltage between a first phase and a second phase of a three-phase power line configured by three phases including the first phase, the second phase, and a third phase; measures a first current as a current of the first phase; determines a direction of rotation of the three phases on the basis of the first voltage and the first current; and computes a shift of a phase of the first current on the basis of the determination of the direction of rotation, thereby computing the change in the current phase for the three phases at low costs even if the direction of rotation of the three-phase power is unknown.

The measurement system may measure a first voltage as a line voltage between a first phase and a second phase of a three-phase power line configured by three phases including the first phase, the second phase, and a third phase; measures a first current as a current of the first phase; determines a direction of rotation of the three phases on the basis of the first voltage and the first current; and computes a shift of a phase of the first current on the basis of the determination of the direction of rotation, thereby computing the change in the current phase for the three phases at low costs even if the direction of rotation of the three-phase power is unknown.

BRIEF DESCRIPTION OF THE DRAWINGS

FIG. 9 is a waveform graph illustrating the second example of the computation results of the first method of determining the direction of phase rotation in the measurement system according to the example.

FIG. 13A is a waveform graph illustrating a normal phase waveform using an interphase voltage between a phase R and phase S as a reference as a first example of a method of verifying the direction of phase rotation in the measurement system according to the example.

FIG. 13B is a waveform graph illustrating a measurement waveform in a CT installation error as a first example of a method of verifying the direction of phase rotation in the measurement system according to the example.

FIG. 14A is a waveform graph illustrating a reversed phase waveform using an interphase voltage between a phase R and phase S as a reference as a first example of a method of verifying the direction of phase rotation in the measurement system according to the example.

FIG. 14B is a waveform graph illustrating a measurement waveform in a CT installation error as a first example of a method of verifying the direction of phase rotation in the measurement system according to the example.

DESCRIPTION OF THE REFERENCE NUMERALS

Figure 1:
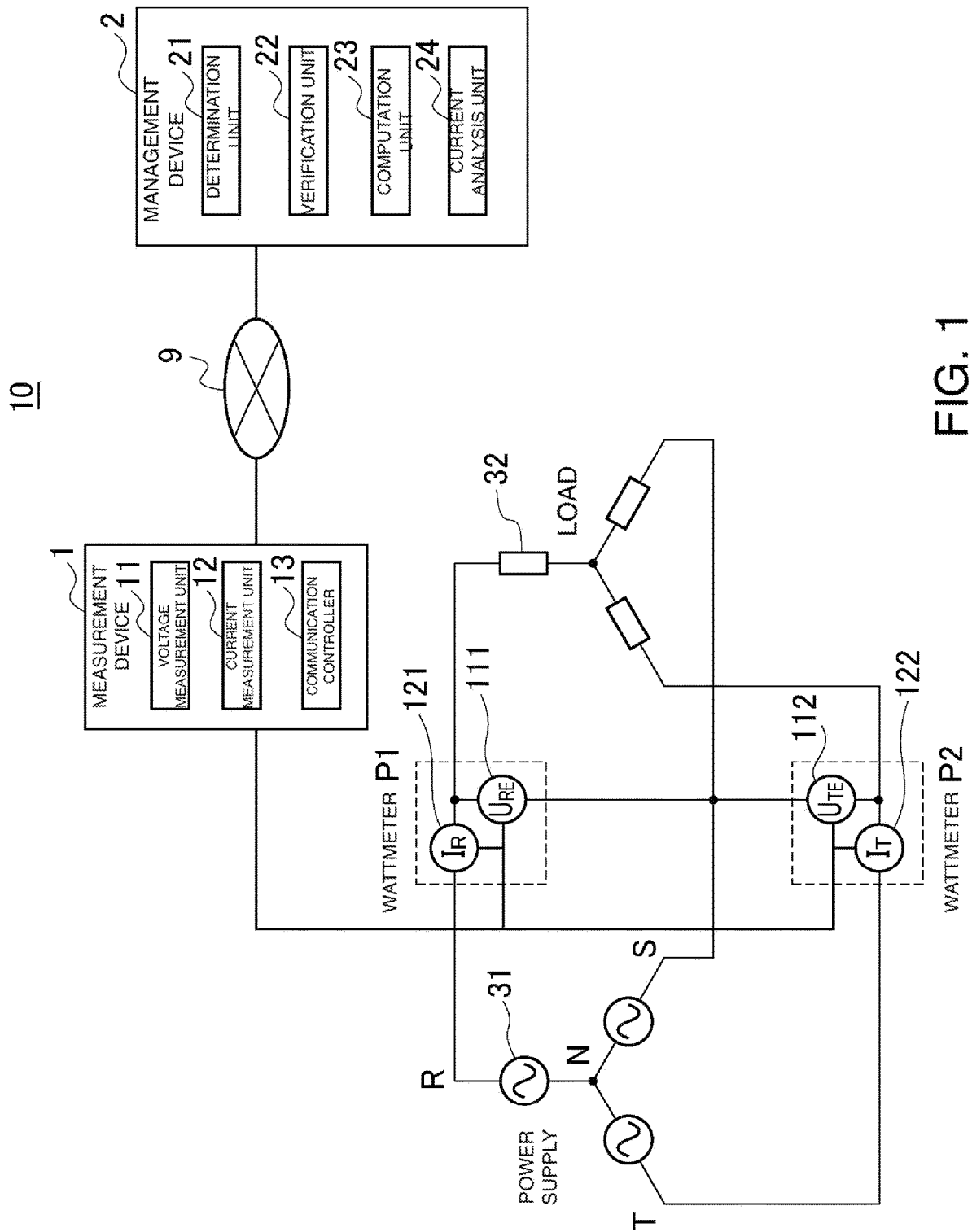
FIG. 1 is a block diagram illustrating an example of a configuration of a measurement system according to an example.

1: measurement device
10: measurement system
101: circuit meter
102: circuit meter
11: voltage measurement unit
P1: wattmeter
P2: wattmeter
111: first voltage measurement unit
112: second voltage measurement unit
113: transformer
114: transformer
12: current measurement unit
121: first current measurement unit
122: third current measurement unit
123: current transformer
124: current transformer
125: secondary current transformer
126: secondary current transformer
13: communication controller
2: management device
21: determination unit
22: verification unit
23: computation unit
24: current analysis unit
31: power supply
32: load
9: network

DETAILED DESCRIPTION

A measurement system, a measurement system control method, and a measurement system control program according to one example will be described in detail with reference to the drawings.

With reference to FIG. 1, first, a configuration of a measurement system will be described. FIG. 1 is a block diagram illustrating a configuration of a measurement system according to an example.

In FIG. 1, a measurement system 10 includes a measurement device 1, a management device 2, a wattmeter P1, and a wattmeter P2. The measurement device 1 includes a voltage measurement unit 11, a current measurement unit 12, and a communication controller 13. The management device 2 includes a determination unit 21, a verification unit 22, a computation unit 23, and a current analysis unit 24. The management device 2 is connected to the management device 2 via network 9 in a communicationable manner. The functional units of the measurement system 10 according to this example above are described as functional modules embodied by a measurement system control program (software) that controls the measurement system 10. The measurement system control program is executed by the measurement device 1 or the management device 2, respectively, in which the corresponding functional modules are embodied.

A power supply 31 is directed to a three-phase power supply configured by phases R, S, and T. The power supply 31 in FIG. 1 illustrates a three-phase AC power supply connected by star connection with a neutral point N. The power supply 31 is connected to the loads 32 by three wires, i.e., a phase R wire, a phase S wire, and a phase R wire. In this example, among the three phases, although phase R may be referred to as phase 1, phase S as phase 2, and phase T as phase 3, phases 1 to 3 are not limited to this. For example, any one of the phase S and phase T may be referred to as phase 1.

The wattmeter P1 includes a first voltage measurement unit 111 and a first current measurement unit 121. The wattmeter P2 includes a second voltage measurement unit 112 and a third current measurement unit 122.

The first voltage measurement unit 111 measures the voltage waveform of the line voltage between the phase R illustrated as the first phase and the phase S illustrated as the second phase (sometimes "first voltage" or "line voltage R-S"). The first current measurement unit 121 measures the current waveform of the current in the line of the phase R (sometimes "first current" or "line R current"). The second voltage measurement unit 112 measures the voltage waveform of the line voltage between the phase T and phase S (line voltage T-S), which is illustrated as the third phase. Further, the third current measurement unit 122 measures the current waveform of the current in the phase T line (sometimes the "third current" or "line T current"). The waveform data of each of the measured first voltage, first current, second voltage, and third current is supplied to the measurement device 1.

The voltage measurement unit 11 measures the voltage waveforms measured by the first and second voltage measurement units 111 and 112. The voltage measurement unit 11 samples the waveforms of the first voltage measured by the first voltage measurement unit 111 or the second voltage measured by the second voltage measurement unit 112 at a certain time point (sometimes a sampling time point). The sampling time point is determined, for example, by a wave counter (not shown in the drawings) that counts the number of waves per one second. The voltage measurement unit 11 measures the zero-crossing point on the basis of the sampled voltage waveform. The zero-crossing point is directed to a point where the voltage waveform reaches 0V (sometimes the "zero voltage point").

The current measurement unit 12 measures the first current measured by the first current measurement unit 121 and the current waveform of the third current measured by the third current measurement unit 122. The current measurement unit 12, for example, samples the current waveform of the first or third current at the sampling time point. The current measurement unit 12 measures the zero-crossing point (sometimes referred to as the "zero current point") on the basis of the sampled current waveform.

The communication controller 13 controls communication between the measurement device 1 and the pair of wattmeters P1 and P2. The communication controller 13 also controls communication between the measurement device 1 and the management device 2 via the network 9. The communication controller 13 may control either wired or wireless communication. For example, the communication controller 13 may control communication using a wireless local area network LAN between the measurement device 1 and the pair of wattmeters P1 and P2. The communication controller 13 may also control communication between the measurement device 1 and the management device 2 using an Internet protocol.

The management device 2 is directed to a device capable of communicating with the measurement device 1 via the network 9, for example, a server capable of communicating with multiple measurement devices 1.

The determination unit 21 determines the direction of rotation of the three phases of the power supply 31 on the basis of the first voltage and the first current. The three-phase power supply includes three phases: phase R, phase S, and phase T. The direction of rotation of the three phases in this example corresponds to the direction of transition of the three phases such as the direction of rotation of normal phase (phase transition) where the voltage phases of the phase R, phase S, and phase T rotate (transition) in the order of R-S-T and the direction of rotation of reversed phase where the voltage phases of the phase R, phase S, and phase T rotate (transition) in the order of T-S-R. For example, in the installation work of the power supply 31 or wiring work from the power supply 31 to the loads 32, the direction of rotation may be unknown before the power is turned on. If the direction of rotation is unknown, in measuring voltage in only one phase, the voltage of the other phases that is not being measured will be unknown, which may result in a phase shift between voltage and current in the other phases or incorrect measurement of power, for example. The determination unit 21 determines the direction of rotation of the three phases, even if the direction of rotation of the three phases is unknown, thereby enabling correct measurements in the measurement system 10.

The determination unit 21 determines the direction of rotation of the three phases in at least one of the first and second determination methods as described below. If the direction of rotation can be determined, the voltage of one phase is measured without actually measuring the voltages of the other two phases, allowing the voltages of the other two phases to be computed by executing a computation in which the phase of the measured voltage waveform is advanced by 120 degrees or delayed by 120 degrees in accordance with the direction of rotation. In the examples, although the direction of rotation of R-S-T is described as the normal phase and the direction of rotation of T-S-R as the reversed phase, the system may be implemented with the direction of rotation of R-S-T as the reversed phase and the direction of direction of T-S-R as the normal phase.

The verification unit 22 verifies the direction of rotation of the three phases determined by the determination unit 21 on the basis of the third current and the second voltage as the line voltage between the second phase (phase S) and the third phase (phase T) measured by the second voltage measurement unit 112. The verification of the direction of rotation is to verify whether the determination of the direction of rotation performed by the determination unit 21 is correct. If the verification results are consistent with the determination results, the determination results are verified as correct. In contrast, if the verification results are inconsistent with the determination results, for example, an installation error of the third current measurement unit 122 is expected.

The verification of the direction of rotation by the verification unit 22 may be performed by the same method as the determination of the direction of rotation by the determination unit 21. For example, if the determination in the determination unit 21 is performed by the first determination method, the verification in the verification unit 22 is also performed by the same method as the first determination method. This allows algorithms and measurement data, for example, in the determination program used in the determination of the determination unit 21 to be shared. The verification method by the verification unit 22 will also be described below in detail.

The computation unit 23, on the basis of at least the determination of the direction of rotation by the determination unit 21, computes the change in the current phase due to the load 32 in each of the first current, the third current, and the second current as the current of the second phase. The change in the current phase due to the load 32 corresponds to the phase difference of the current relative to the voltage in each phase due to the load 32. If the load 32 corresponds to a load containing inductive reactance, the current phase delays behind the voltage phase, that is, the power factor is degraded. The inductive reactance varies from device to device, and the change in phase is computed, which may identify the devices in the load 32.

The current analysis unit 24 analyzes the current in the phases. The current analysis unit 24 analyzes, for example, the type of devices included in the load 32 or the operating state of the devices on the basis of the current value, current waveform, or phase difference between the current and voltage. For example, the characteristics for each device that may be observed in the load current at the load 32 are stored in advance as a database, and the current analysis unit 24 compares the measured current waveforms, for example, with the data stored in the database to analyze the type of the device. The characteristics for each device correspond to, for example, current value, changes in current values over time, power factor, and the shape of noise from the device that is mixed into the current line. The current analysis unit 24 may analyze multiple types of devices, for example, by separating the characteristics of the measured current waveforms for each device.

The functional units described above that the measurement system 10 includes are examples of functional units that each device includes, and are not intended to limit the functions that each device includes. For example, the functional units described as being possessed by the measurement device 1 may be implemented in the management device 2. The functional units described as being possessed by the management device 2 may also be implemented in the measurement device 1. Each device need not have all of the functional units above, but may have some of them. Each device may also have other functions other than those described above.

Each of the functional units described above is described as being software. However, at least one or more of the functional units above may be hardware.

Any of the functional units above may be implemented by dividing one functional unit into multiple functional units. In addition, any two or more of the functional units above may be integrated into one functional unit. That is, FIG. 1 represents the functions in the measurement system 10 in terms of functional blocks, and does not show, for example, that each functional unit is configured by a separate program file.

Each device may be directed to a device embodied by a single housing or a system embodied by multiple devices connected via a network or other means. For example, the measurement device 1 or management device 2 may be a virtual device such as a cloud service provided by a cloud computing system, for some or all of its functions. That is, the measurement device 1 or management device 2 may be at least one or more of the functional units in the other devices. The measurement device 1 or management device 2 may be a general-purpose computer such as a desktop PC or server device, or it may be a dedicated device with limited functions.

Figure 2A:
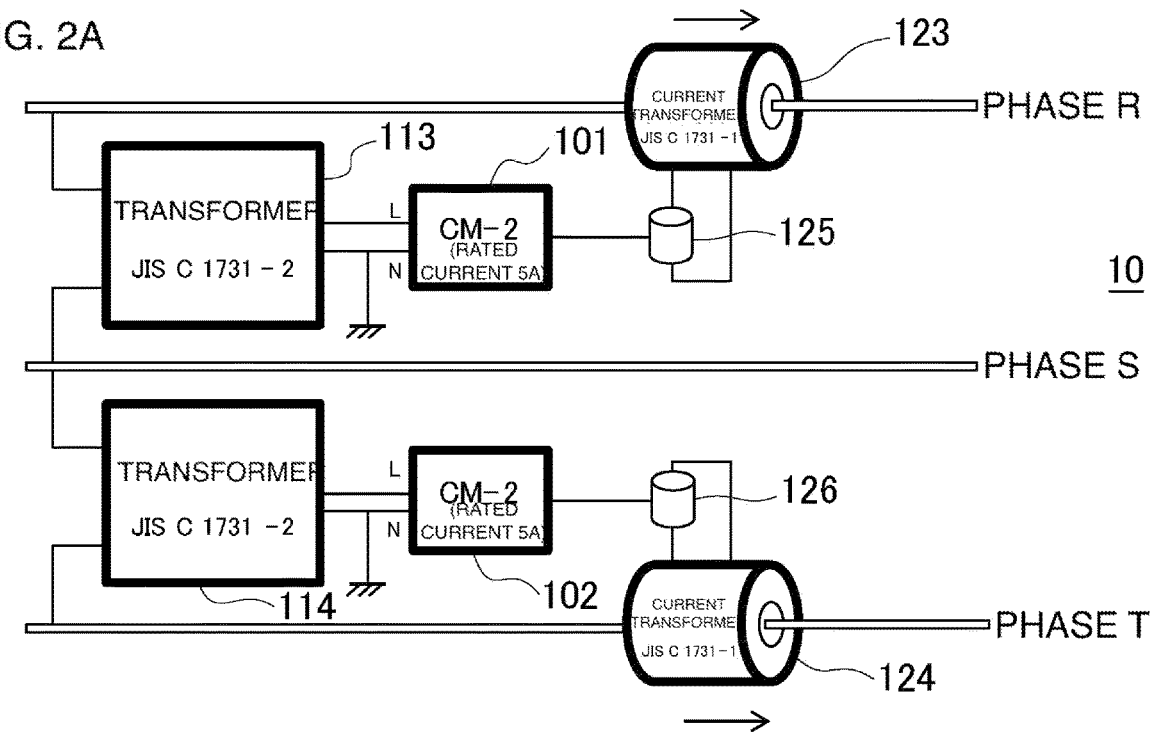
FIG. 2A is a block diagram illustrating a first example of a device configuration of the measurement system according to the example.
Figure 2B:
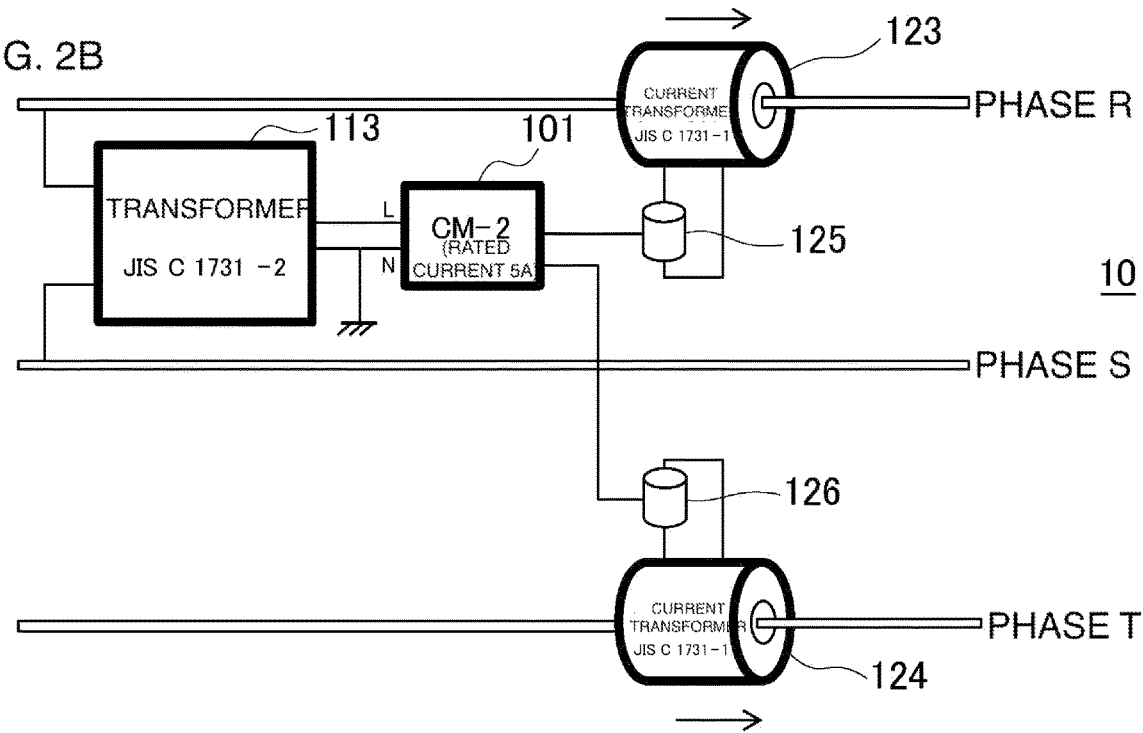
FIG. 2B is a block diagram illustrating a second example of a device configuration of the measurement system according to the example.

Next, with reference to FIGS. 2A and 2B, the device configuration of the measurement system 10 will be described. FIG. 2A is a block diagram illustrating a first example of a device configuration of the measurement system, and FIG. 2B is a block diagram illustrating a second example of a device configuration of the measurement system.

In FIG. 2A, the measurement system 10 includes a circuit meter 101, a circuit meter 102, a transformer 113, a transformer 114, a current transformer 123, a current transformer 124, a secondary current transformer 125, and a secondary current transformer 126.

The transformer 113 is directed to a step-down transformer that steps down the first voltage as an interphase voltage between the phase R (phase 1) and phase S (phase 2) at a certain winding ratio. On the secondary side of the transformer 113, one output line (L) is connected to the circuit meter 101 and the other output line (N) is grounded and connected to the circuit meter 101. This allows the circuit meter 101 to measure the first voltage stepped down by the winding ratio of the transformer 113.

The transformer 114 is directed to a step-down transformer that steps down the second voltage as an interphase voltage between the phase T (phase 3) and phase S (phase 2) at a certain winding ratio. On the secondary side of the transformer 114, one output line (L) is connected to the circuit meter 102 and the other output line (N) is grounded and connected to the circuit meter 102. This allows the circuit meter 102 to measure the first voltage stepped down by the winding ratio of the transformer 114.

The current transformer 123 transforms the current (first current) of phase R (phase 1). The secondary current transformer 125 transforms the output current of the current transformer 123 obtained by transforming the first current. The transformed output current of the secondary current transformer 125 is supplied to the circuit meter 101.

The current transformer 124 transforms the current (third current) of phase T (phase 3). The secondary current transformer 126 transforms the output current of the current transformer 124 obtained by transforming the third current. The transformed output current of the secondary current transformer 126 is supplied to the circuit meter 102. Further, the transformed output current of the secondary current transformer 126 is also supplied to the circuit meter 101. The phase S current (second current) can be measured by the vector sum of the first and second currents.

The measurement system 10 shown in FIG. 2A can measure the waveform of the interphase voltage between the phase R and phase S as well as the waveform of the phase R current by measuring the first voltage (interphase voltage R-S) and the first current (phase R current), and also measure the waveform of the interphase voltage between the phase T and phase S or the interphase voltage between the phase R and phase S as well as the waveform of the phase T current by measuring the second voltage (interphase voltage T-S) and the third current (phase T current).

In FIG. 2B, the measurement system 10 includes a circuit meter 101, a transformer 113, a current transformer 123, a current transformer 124, a secondary current transformer 125, and a secondary current transformer 126. The description redundant with respect to those in FIG. 2A may be omitted.

The current transformer 124 transforms the current (third current) of phase T (phase 3). The secondary current transformer 126 transforms the output current of the current transformer 124 obtained by transforming the third current. The transformed output current of the secondary current transformer 126 is supplied to the circuit meter 101. That is, the phase R current and the phase T current are supplied to the circuit meter 101.

The measurement system 10 shown in FIG. 2B can measure the waveform of the interphase voltage between the phase R and phase S as well as the waveform of the phase R current by measuring the interphase voltage R-S and the phase R current, and also measure the waveform of the interphase voltage R-S as well as the waveform of the phase T current by measuring the phase T current.

First Determination Method

Next, with reference to FIGS. 3 to 7, the first method of determining the direction of rotation of the three phases will be descried.

Figure 3:
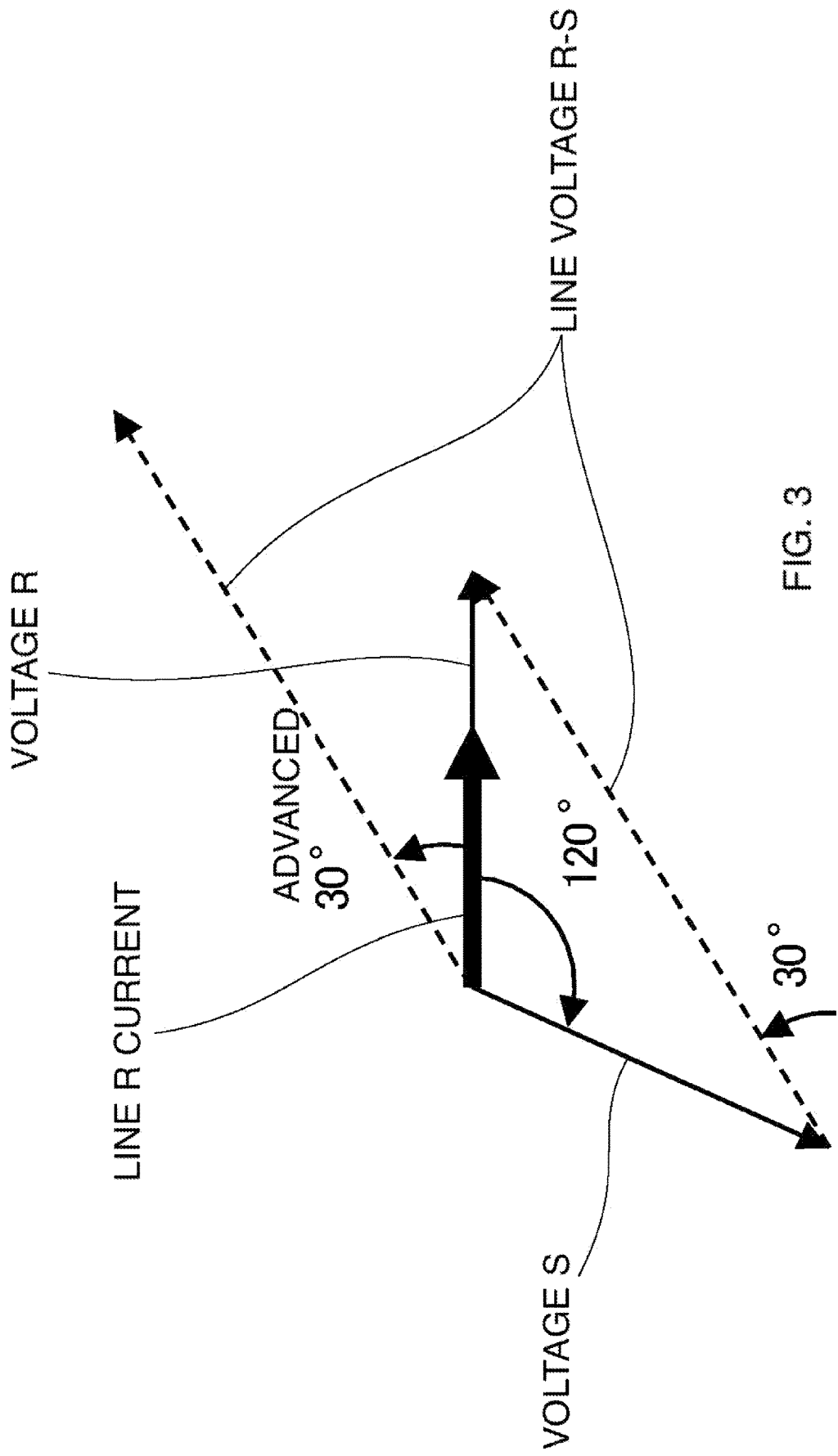
FIG. 3 is a vector diagram illustrating the first example of the first method of determining the direction of phase rotation in the measurement system according to the example.

FIG. 3 is a vector diagram illustrating the first example of the first method of determining the direction of phase rotation in the measurement system according to the example. FIG. 3 shows when the direction of rotation of the three phases corresponds to a normal phase. In the normal phase, the voltage rotates in the order of R-S-T so that the phase of the voltage S is delayed by 120 degrees from that of the voltage R. The first voltage corresponds to the interphase voltage between the phase R and phase S (voltage R-S). The first voltage is V3 times the voltage R if the voltage R and voltage S are equal to each other. If no phase difference is present between the phase R voltage and the phase R current, the phase of the first voltage will be 30 degrees ahead of the phase of the line R current as the first current (the phase of the first current will be 30 degrees behind the phase of the first voltage).

In the first determination method, the determination unit 21 compares the phase of the first voltage with the phase of the first current, and if the determination unit 21 determines that the phase of the first voltage is 30 degrees ahead of the phase of the first current, the determination unit 21 is capable of determining that the direction of rotation of the three phases corresponds to a normal phase. For example, the determination unit 21 measures the change of the first voltage and the first current over time, allowing the determination unit 21 to determine that the phase of the first voltage is 30 degrees ahead of the phase of the first current.

The first determination method described above and the second determination method described below may also be implemented in the verification unit 22. That is, the verification unit 22 is capable of determining the direction of rotation of the three phases on the basis of the first or second determination method. For example, the example above describes a configuration in which the direction of rotation is determined by comparing the phase of the line voltage R-S as the first voltage with the phase of the current R as the first current. However, the first determination method may also be implemented by comparing the phase of the line voltage T-S with the phase of the current T. The direction of rotation determined on the basis of the line voltage R-S and the first current coincides with the direction of rotation determined on the basis of the comparison of the phase of the line voltage T-S with the phase of the current T. If the directions of rotation do not coincide with each other, the device may have been erroneously installed. The verification unit 22, for example, on the basis of the phase of the line voltage T-S and the phase of the current T, determines the direction of rotation, which has been determined in the determination unit 21 on the basis of the phase of the line voltage R-S and the phase of the current T, allowing the verification unit 22 to verify the determination results determined by the determination unit 21.

Figure 4:
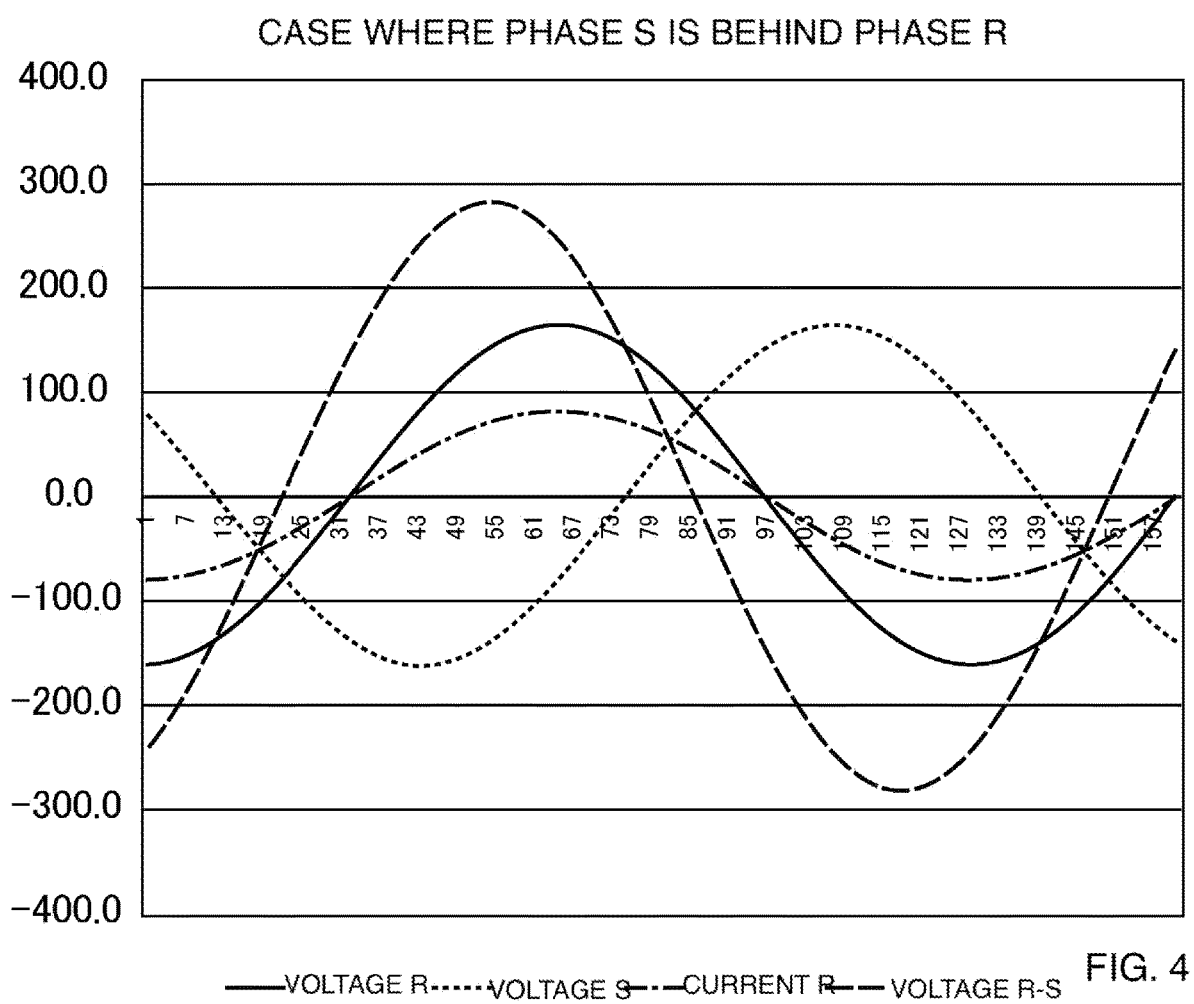
FIG. 4 is a waveform graph illustrating the first example of the first method of determining the direction of phase rotation in the measurement system according to the example.

FIG. 4 is a waveform graph illustrating the first example of the first method of determining the direction of phase rotation in the measurement system. FIG. 4 is a waveform graph illustrating the voltage R, voltage S, current R, and voltage R-S shown in FIG. 3 in time series. As in FIG. 3, the phase of the first voltage is 30 degrees ahead of the phase of the line R current as the first current.

Figure 5:
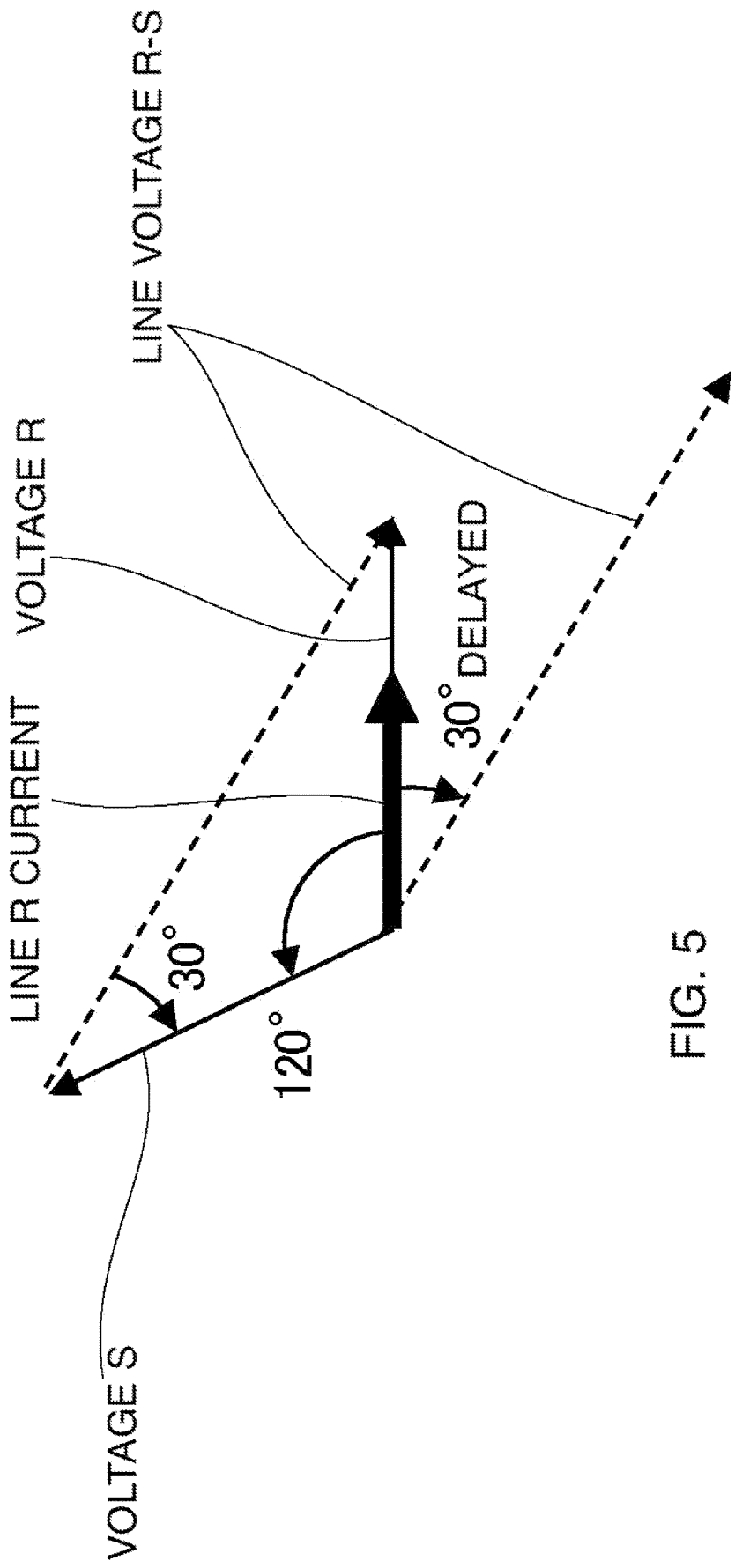
FIG. 5 is a vector diagram illustrating the second example of the first method of determining the direction of phase rotation in the measurement system according to the example.

FIG. 5 is a vector diagram illustrating the second example of the first method of determining the direction of phase rotation in the measurement system 10. FIG. 5 shows when the direction of rotation of the three phases corresponds to a reversed phase. In the reversed phase, the voltage rotates in the order of T-S-R so that the voltage S is 120 degrees ahead of the voltage R. If no phase difference is present between the phase R voltage and the phase R current, the phase of the first voltage will be 30 degrees behind the phase of the line R current as the first current (the phase of the first current will be 30 degrees ahead of the phase of the first voltage).

In the first determination method, the determination unit 21 compares the phase of the first voltage with the phase of the first current, and if the determination unit 21 determines that the phase of the first voltage is 30 degrees behind the phase of the first current, the determination unit 21 is capable of determining that the direction of rotation of the three phases corresponds to a reversed phase.

Figure 6:
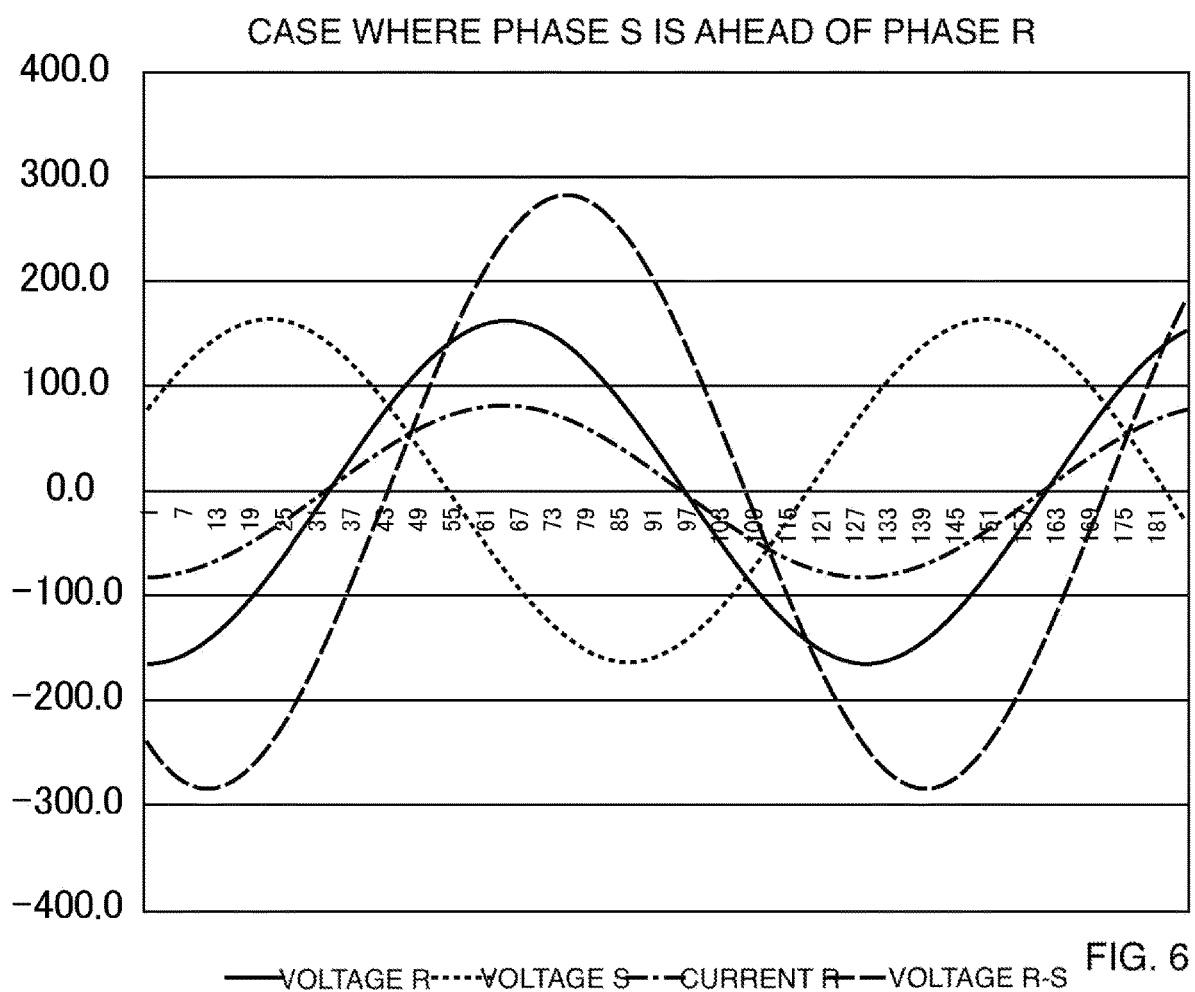
FIG. 6 is a waveform graph illustrating the second example of the first method of determining the direction of phase rotation in the measurement system according to the example.

FIG. 6 is a waveform graph illustrating the second example of the first method of determining the direction of phase rotation in the measurement system 10. FIG. 6 is a waveform graph illustrating the voltage R, voltage S, current R, and voltage R-S shown in FIG. 5 in time series. As in FIG. 5, the phase of the first voltage is 30 degrees behind the phase of the line R current as the first current. For example, the determination unit 21 measures the change of the first voltage and the first current over time, allowing the determination unit 21 to determine that the phase of the first voltage is 30 degrees behind the phase of the first current.

Figure 7:
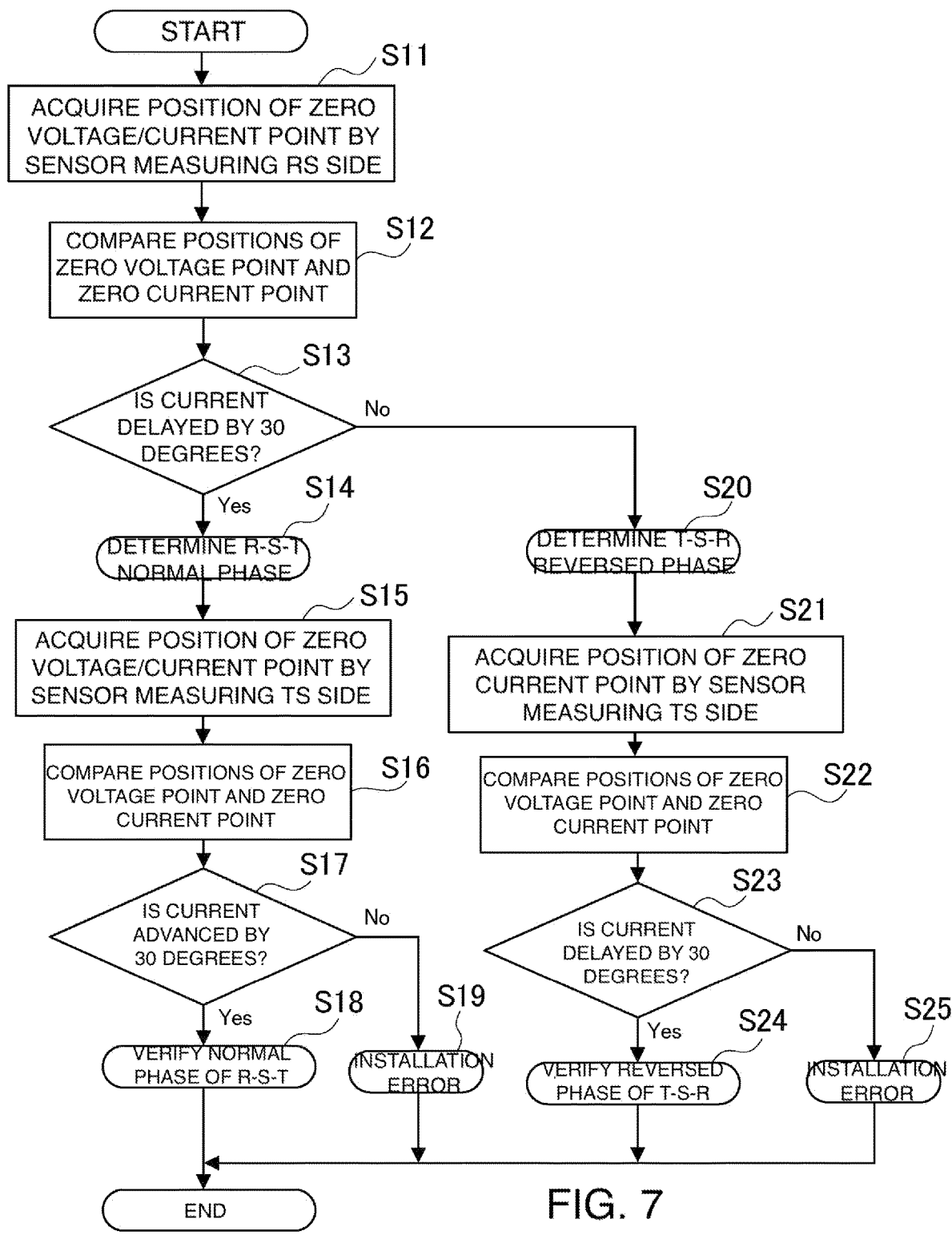
FIG. 7 is a flowchart showing an example of the operation of the first method of determining the direction of phase rotation in the measurement system according to the example.

FIG. 7 is a flowchart showing an example of the operations of the first method of determining the direction of phase rotation in the measurement system 10. In the following flowchart, a description is given assuming that the measurement system 10 is the subject executing the process, but the operations shown in the flowchart are executed by the functional units of the measurement system 1 described in FIG. 1.

In FIG. 7, the measurement system 10 acquires the position of the zero point (zero crossing point) of the first voltage and the first current by the wattmeter P1, which measures the RS side (step S11). In the measurement system 10, for example, the determination unit 21 of the management device 2 determines the positions of the zero voltage point and the zero current point on the basis of the voltage waveform measured by the first voltage measurement unit 111 and the current waveform measured by the first current measurement unit 121 of the wattmeter P1.

After executing the process in step S11, the measurement system 10 compares the position of the zero voltage point of the first voltage with the position of the zero current point of the first current (step S12). The measurement system 10 determines whether the first current is 30 degrees behind the first voltage (step S13). If the measurement system 10 determines that the first current is delayed by 30 degrees (step S13: YES), the measurement system 10 determines that the direction of rotation of the three phases corresponds to a normal phase of R-S-T (step S14).

After executing the process in step S14, the measurement system 10 acquires the position of the zero point (zero crossing point) of the second voltage and the third current by the wattmeter P2, which measures the TS side (step S15). In the measurement system 10, for example, the determination unit 21 of the management device 2 determines the positions of the zero voltage point and the zero current point on the basis of the voltage waveform measured by the second voltage measurement unit 112 and the current waveform measured by the third current measurement unit 122 of the wattmeter P2.

After executing the process in step S15, the measurement system 10 compares the position of the zero voltage point of the second voltage with the position of the zero current point of the third current (step S16). Next, the measurement system 10 determines whether the third current is 30 degrees ahead of the second voltage (step S17). If the measurement system 10 determines that the third current is advanced by 30 degrees (step S17: YES), the measurement system 10 determines that the direction of rotation of the three phases corresponds to a normal phase of R-S-T (step S18). Whether the determination results of the direction of rotation made in step S14 is normal is verified in the process in step S18.

In contrast, if the measurement system 10 does not determine that the third current is advanced by 30 degrees (step S17: NO), the measurement system 10 determines that the device has been erroneously installed. The installation error of the device corresponds to, for example, an installation error in which a current measurement unit that should originally be installed in the phase T is erroneously installed in the phase S. Since the direction of rotation of three-phase lines cannot be confirmed if a measurement device fails to check it in an energized state, the device may be erroneously installed in a phase different from the phase in which it should be originally installed. The direction of rotation is verified, allowing the installation error to be determined.

In the process in step S13, if the measurement system 10 does not determine that the first current is delayed by 30 degrees (step S13: NO), the measurement system 10 determines that the direction of rotation of the three phases corresponds to a reversed phase of T-S-R (step S20).

After executing the process in step S20, the measurement system 10 acquires the position of the zero point (zero crossing point) of the second voltage and the third current by the wattmeter P2, which measures the TS side (step S21). In the measurement system 10, for example, the determination unit 21 of the management device 2 determines the positions of the zero voltage point and the zero current point on the basis of the voltage waveform measured by the second voltage measurement unit 112 and the current waveform measured by the third current measurement unit 122 of the wattmeter P2.

After executing the process in step S21, the measurement system 10 compares the position of the zero voltage point of the second voltage with the position of the zero current point of the third current (step S22). Next, the measurement system 10 determines whether the third current is 30 degrees behind the second voltage (step S23). If the measurement system 10 determines that the third current is delayed by 30 degrees (step S23: YES), the measurement system 10 determines that the direction of rotation of the three phases corresponds to a reversed phase of T-S-R (step S24). The determination results of the direction of rotation made in step S20 is verified in the process in step S24.

In contrast, if the measurement system 10 does not determine that the third current is delayed by 30 degrees (step S23: NO), the measurement system 10 determines that the device has been erroneously installed.

After the process in step S18, the process in step S19, the process in step S24 or the process in step S25 is executed, the measurement system 10 completes the operations shown in the flowchart.

Second Determination Method

Next, the second method of determining the direction of rotation of the three phases will be described with reference to FIGS. 8 to 12.

The second determination method computes power values on the basis of the measured line voltage and line current, and determines the direction of rotation from the phase relationship where the power value is maximum among the computed power values. As mentioned above, when the line voltage RS is used as a reference, the phase relationship between the line voltage RS and the line R current is either a state where the phase difference of the line R current is +30 (the phase is delayed by 30 degrees) or a state where the phase difference is −30 degrees (the phase is advanced by 30 degrees). When the line voltage RS is used as a reference, the phase relationship between the line voltage TS and the line T current is either a state where the phase difference of the line T current is −30 (the phase is advanced by 30 degrees) or a state where the phase difference is +30 degrees (the phase is delayed by 30 degrees).

In the second method of determination, the power value is obtained from the product of line voltage and line current at each of the phase differences above. That is, the power value in when the phase difference of the line R current with respect to the line voltage RS is +30 degrees and the power value in when the phase difference of the line R current with respect to the line voltage RS is −30 degrees are computed, and the phase difference with the greater power value allows the direction of rotation to be determined. In the second method of determination, this can be performed if the load power factor is approximately 0.9 or greater (phase difference between the line voltage and line current is within approximately ±26 degrees).

In addition, the direction of rotation may be verified in the second method of determination as well. For example, the phase difference where the power value becomes maximum is determined from the line voltage TS and the line T current, and whether it coincides with the direction of rotation is determined from the line voltage TS and line T current, thereby verifying the determination results.

Figure 8:
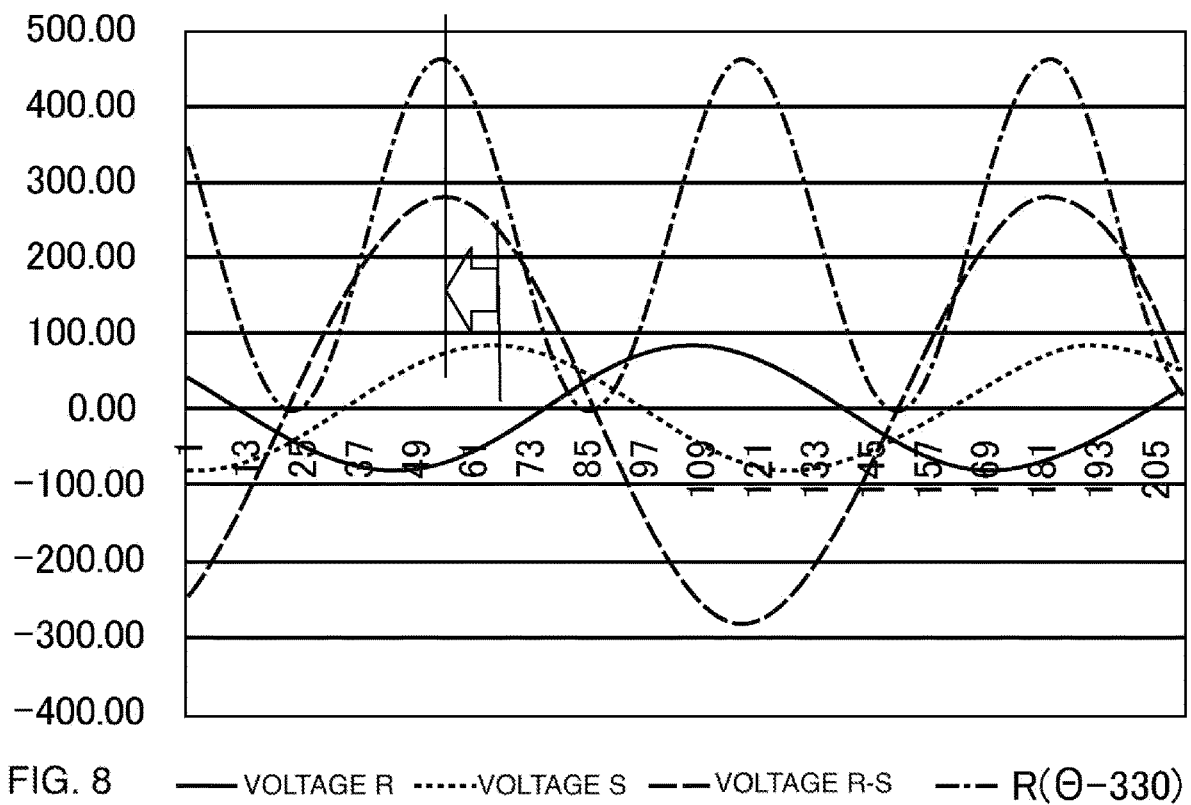
FIG. 8 is a waveform graph illustrating the first example of the computation results of the first method of determining the direction of phase rotation in the measurement system according to the example.

FIG. 8 is a waveform graph illustrating the first example of the computation results of the first method of determining the direction of phase rotation in the measurement system. FIG. 9 is a waveform graph illustrating the second example of the computation results of the first method of determining the direction of phase rotation in the measurement system.

FIG. 8 shows when the line voltage R-S is 30 degrees ahead of the line R current. If the line voltage R-S is 30 degrees ahead of the line R current, as described above, the direction of rotation of three phases corresponds to a normal phase of R-S-T. In the second method of determination, power values are obtained by multiplying the line voltage R-S by six current waveforms with the measured line R currents of which phase being delayed by 30, 90, 150, 210, 270 and 330 degrees, and then the phase in which the power value is maximum is obtained from among the six current waveforms, thereby determining the phase in which the line voltage R-S is 30 degrees ahead of the line R current. This determines the direction of rotation.

FIG. 9 shows when the line voltage R-S is 30 degrees behind the line R current. If the line voltage R-S is 30 degrees behind the line R current, as described above, the direction of rotation of three phases corresponds to a reversed phase of T-S-R. Power values are obtained by multiplying the line voltage R-S by six current waveforms with the measured line R currents of which phase being delayed by 30, 90, 150, 210, 270 and 330 degrees, and then the phase in which the power value is maximum is obtained from among the six current waveforms, thereby determining the phase in which the line voltage R-S is 30 degrees behind the line R current. This determines the direction of rotation.

In the line voltage R-S and line R current described above, an example is illustrated in which the phase of the measured current is changed by 60 degrees and the power value is computed. However, when the line voltage T-S and line T current are further measured, additional six computations (12 computations in total) may be performed.

In the second determination method, the phase shift between the phase voltage and phase current (power factor) effects the measurement. For example, in an actual measurement environment, the phase difference in which the power value becomes maximum is not exactly ±30 degrees since the phase advances due to the power factor correction capacitor and phase is delayed due to the motor load, for example. However, load facilities are designed such that the power factor during the rated operation is as close to one as possible to reduce power consumption in factories, for example. Therefore, a long time measurement to reduce the influence of load variations as possible, and a determination of the phase relationship between both R-S and T-S side measurements are performed, thereby determining the correct phase relationship. In addition to ±30 degrees, six different computations are performed by changing the phase of the current waveform by 60 degrees, enabling detection of installation errors during sensor installation.

Figure 10A:
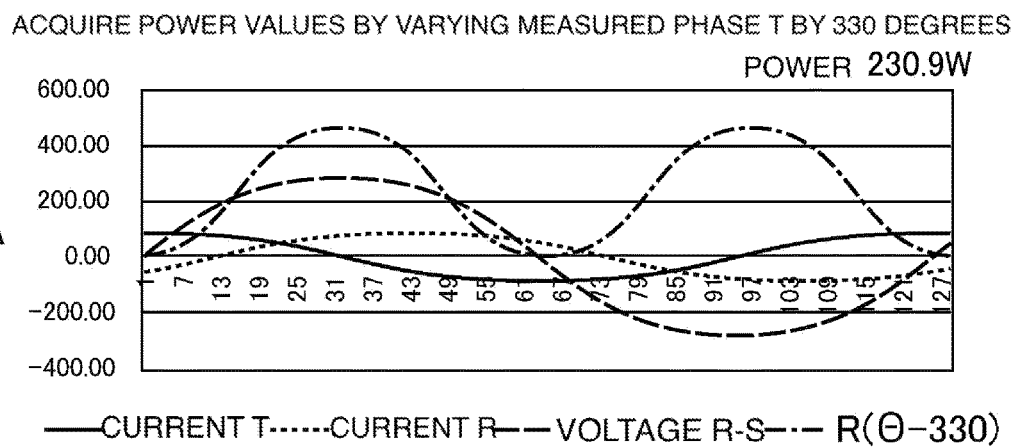
FIG. 10A is a waveform graph illustrating when a power value is maximum as the first example of the second method of determining the direction of phase rotation in the measurement system according to the example.
Figure 10B:
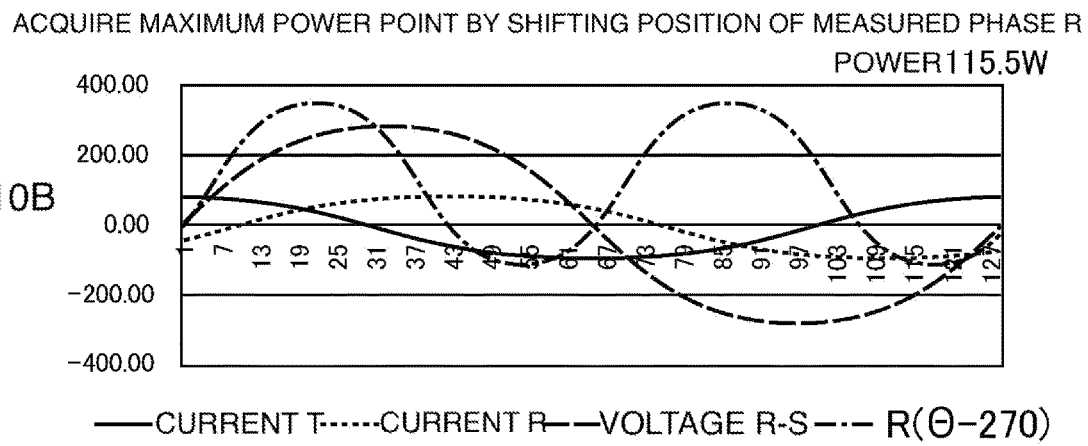
FIG. 10B is a waveform graph illustrating when the power value is minimum as the first example of the second method of determining the direction of phase rotation in the measurement system according to the example.

FIGS. 10A and 10B each are a waveform graph illustrating the first example of the second method of determining the direction of phase rotation in the measurement system. As described above, the measurement of power involves six different operations with the current phase changed by 60 degrees. In FIGS. 10A and 10B, and FIGS. 11A and 11B, two of these are illustrated, i.e., when the absolute value of power is maximum and when the absolute value of power is minimum.

FIGS. 10A and 10B show a method of detecting the phase relationship between the phase of the line voltage R-S and the phase of the current R by the second determination method. In the second method, as described above, six different power values are computed in which the phase of line R current is changed by 60 degrees. FIG. 10A shows the waveform graph in when the line R current is advanced by 30 degrees (delayed by 330 degrees), and the power value is 230.9 W, which is maximum among the six power values. FIG. 10B shows the waveform graph in when the line R current is advanced by 90 degrees (delayed by 270 degrees) and the absolute value of the power value is 115.5 W as a minimum value. The power value is maximum when the line R current is advanced by 30 degrees, determining that the direction of rotation is normal phase of R-S-T.

Figure 11A:
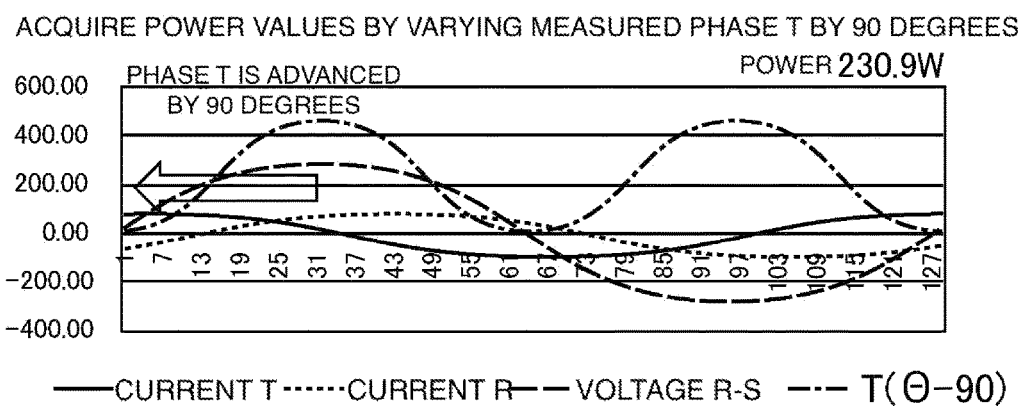
FIG. 11A is a waveform graph illustrating when a power value is maximum as the second example of the second method of determining the direction of phase rotation in the measurement system according to the example.
Figure 11B:
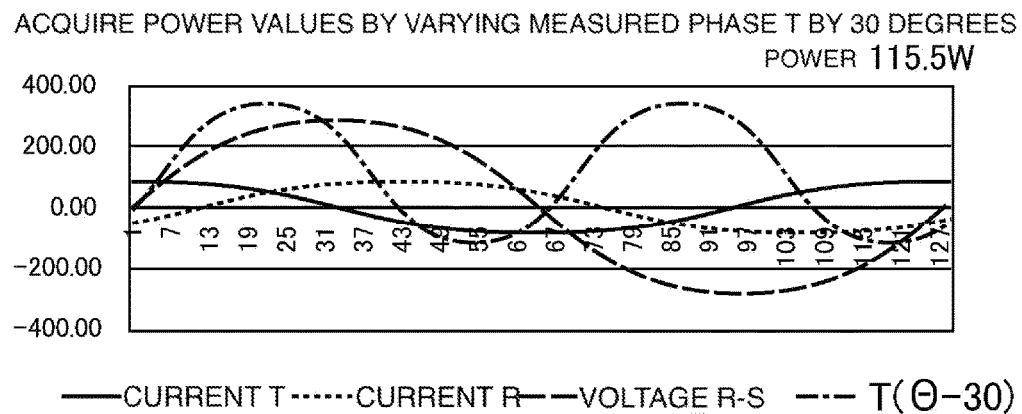
FIG. 11B is a waveform graph illustrating when the power value is minimum as the second example of the second method of determining the direction of phase rotation in the measurement system according to the example.

FIGS. 11A and 11B each are a waveform graph illustrating the second example of the second method of determining the direction of phase rotation in the measurement system. FIGS. 11A and 11B show a method of detecting the phase relationship between the phase of the line voltage R-S and the phase of the current T by the second determination method. FIG. 11A shows the waveform graph in when the line R current is advanced by 270 degrees (delayed by 90 degrees), and the power value is 230.9 W, which is maximum among the six power values. FIG. 11B shows the waveform graph in when the line T current is advanced by 330 degrees (delayed by 30 degrees) and the absolute value of the power value is 115.5 W as a minimum value. The power value is maximum when the line T current is advanced by 330 degrees, determining that the direction of rotation is normal phase of R-S-T. For example, the determination on the basis of the phase T current in FIGS. 11A and 11B is performed after the determination on the basis of the phase R current in FIGS. 10A and 10B, thereby verifying the results of the determination on the basis of the phase R current.

Figure 12:
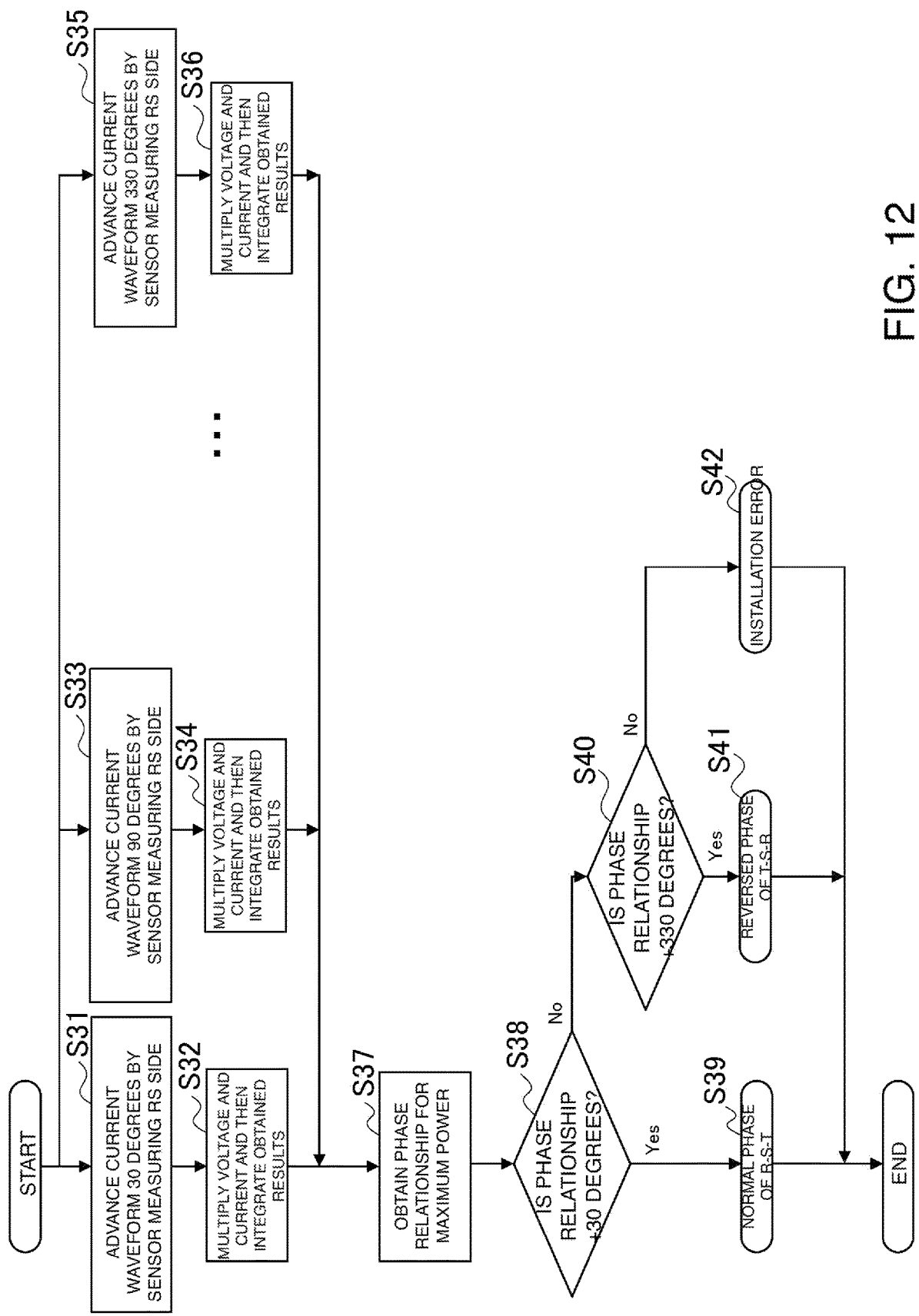
FIG. 12 is a flowchart showing an example of the operations of the second method of determining the direction of phase rotation in the measurement system according to the example.

FIG. 12 is a flowchart showing an example of the operation of the second method of determining the direction of phase rotation in the measurement system 10.

In FIG. 12, the measurement system 10 performs the processes in steps S31 to S35 in parallel. In the process of step S31, the measurement system 10 performs a computation in which the interphase voltage R-S and current R are measured, and the current waveform of the measured current R is advanced by 30 degrees (step S31). After performing the process of step S31, the measurement system 10 obtains a vector product from the interphase voltage R-S and the current R advanced by 30 degrees, and then integrates it in one cycle to compute the power value (step S32).

In the same manner, the measurement system 10 performs a computation to advance the current waveform of the measured current R by 90 degrees (step S33). After performing the process of step S33, the measurement system 10 obtains a vector product from the interphase voltage R-S and the current R advanced by 90 degrees, and then integrates it in one cycle to compute the power value (step S34). The measurement system 10 performs computations to advance the current waveform of the measured current R by 150 degrees, 210 degrees, and 270 degrees, respectively, which are omitted from the drawings, and also performs a computation to advance the current waveform of the measured current R by 330 degrees (step S35) to compute the power value (step S36).

After performing the steps S32 to S36, the measurement system 10 obtains the phase relationship of the current R with respect to the interphase voltage R-S in which the power value is maximum (step S37). Next, the measurement system 10 determines whether the phase relationship corresponds to +30 degrees (step S38). If the measurement system 10 determines that the positional relationship corresponds to +30 degrees (step S38: YES), the measurement system 10 determines that the direction of rotation of the three phases corresponds to a normal phase of R-S-T (step S39).

In contrast, if the measurement system does not determine that the phase relationship corresponds to +30 degrees (step S38: NO), the measurement system 10 determines whether the phase relationship corresponds to +330 degrees (−30 degrees) (step S40). If the measurement system 10 determines that the positional relationship corresponds to +330 degrees (step S40: YES), the measurement system 10 determines that the direction of rotation of the three phases corresponds to a reversed phase of T-S-R (step S41).

In contrast, if measurement system 10 does not determine that the phase relationship corresponds to +330 degrees (step S40: NO), the measurement system 10 determines that the device is erroneously installed (step S42). That is, in the process of step S40, whether the determination in step S38 is inconsistent with the determination in step S40 is determined, thereby verifying the determination of the direction of rotation in the process of step S39. With reference to FIGS. 13A and 13B, and FIGS. 14A and 14B, examples of the measurement of the waveforms in when the verification in the process of step S40 determines that the device is erroneously installed will be described.

After performing the step S39, S41 or S42, the measurement system 10 completes the operations shown in the flowchart.

Next, with reference to FIGS. 13A and 13B, and FIGS. 14A and 14B, examples of waveforms when a device is determined to have been erroneously installed in the verification will be described below. FIG. 13A is a waveform graph illustrating a normal phase waveform using an interphase voltage between a phase R and phase S as a reference as a first example of a method of verifying the direction of phase rotation in the measurement system, and FIG. 13B is a waveform graph illustrating a measurement waveform in a CT installation error as a first example of a method of verifying the direction of phase rotation in the measurement system.

FIG. 13A is a waveform graph showing the interphase voltage R-S, current R, and current T in when the direction of rotation corresponds to the normal phase. The determination that the direction of rotation is the normal phase may be made from the waveform data of the interphase voltage R-S and current R as described above. If a current measurement unit (CT) that should originally be installed in the phase T is installed in the phase S due to an installation error, the waveform data of the current in the phase S will be measured in place of the current in the phase T as shown in FIG. 13B. In this example, the direction of rotation that is inconsistent with the determination result in the verification of the direction of rotation will be determined.

FIG. 14A is a waveform graph illustrating a reversed phase waveform using an interphase voltage between a phase R and phase S as a reference as a first example of a method of verifying the direction of phase rotation in the measurement system, and FIG. 14B is a waveform graph illustrating a measurement waveform in a CT installation error as a first example of a method of verifying the direction of phase rotation in the measurement system.

FIG. 14A is a waveform graph showing the interphase voltage R-S, current R, and current T in when the direction of rotation corresponds to the reversed phase. The determination that the direction of rotation is the reversed phase may be made from the waveform data of the interphase voltage R-S and current R as described above. If a current measurement unit (CT) that should originally be installed in the phase T is installed in the phase S due to an installation error, the waveform data of the current in the phase S will be measured in place of the current in the phase T as shown in FIG. 14B. In this example, the direction of rotation that is inconsistent with the determination result in the verification of the direction of rotation will be determined.

A program embodying the functions configuring the devices described in this example may be stored in a computer-readable recording medium, and a computer system may be caused to read and execute the program stored in the recording medium to perform the various processes described above. The phrase "computer system" here may include hardware such as operating systems and peripheral devices. The "computer system" may also include the environment for providing the web site (or the display environment), if the www system is employed. In addition, the phrase "computer readable recording medium" may include flexible disks, optical magnetic disks, ROMs, writable non-volatile memory such as flash memory, a portable media such as CD-ROMs, and storage devices such as hard disks that are built into computer systems.

Further, "a computer readable recording medium" may include any medium that stores programs for a certain period of time such as a volatile memory (e.g., dynamic random access memory DRAM) inside the computer system that serves as a server or client when the program is transmitted over a network such as the Internet or a communication line such as a telephone line. The above program may be transmitted from the computer system that stores the program in a storage device or other device to another computer system via a transmission medium or by transmission waves in the transmission medium. The "transmission medium" that transmits the program refers to a medium that has the function of transmitting information such as a network (communication network) such as the Internet or a communication channel (communication line) such as a telephone line. The program above may also be used to embody some of the functions described above. Furthermore, the functions described above may be embodied by being combined with the programs that have already stored in the computer system, i.e., difference files (difference programs).

The examples in this disclosure have been described above with reference to the drawings, but the specific configuration is not limited to these examples. Various modifications are also included to the extent that they do not depart from the spirits of this disclosure.

The invention claimed is:

1. A measurement system comprising:
    a computer system coupled to a non-transitory computer-readable recording medium configured to store a program that, when executed, causes the computer system to:
    measure, by a first voltage measurement unit, a first voltage as a line voltage between a first phase and a second phase of a three-phase power supply;
    measure, by a first current measurement unit, a first current as a current of the first phase;
    measure, by a third current measurement unit, a third current as a current of a third phase of the three-phase power supply;
    determine, by a determination unit, a direction of rotation of the first phase, the second phase, and the third phase by comparing one or more electrical characteristics of the first voltage and the first current; and
    compute, by a computation unit, a shift in phase of the first current based on the direction of rotation to determine a change in a current phase for the first phase, the second phase, and the third phase.

2. The measurement system according to claim 1, wherein the program, when executed, further causes the computer system to:
    measure, by a second voltage measurement unit, a second voltage as a line voltage between the second phase and the third phase; and
    verify, by a verification unit, the direction of rotation based on the second voltage and the third current.

3. The measurement system according to claim 2, wherein the program, when executed, further causes the computer system to:
    determine, by the determination unit, an installation error of the third current measurement unit based on a result of the verification of the direction of rotation.

4. The measurement system according to claim 1, wherein the one or more electrical characteristics comprise a phase difference between the first voltage and the first current.

5. The measurement system according to claim 4, wherein the comparing comprises determining whether a phase of the first voltage is ahead of a phase of the first current or behind the phase of the first current.

6. The measurement system according to claim 1, wherein the one or more electrical characteristics comprise a power value computed from the first voltage and the first current.

7. The measurement system according to claim 6, wherein the comparing comprises:
    computing a first power value from the first voltage and the first current with the phase advanced;
    computing a second power value computed from the first voltage and the first current with phase delayed; and
    comparing a magnitude of the first power value and a magnitude of the second power value.

8. A method for use in a measurement system, the method comprising:
    receiving, by a computer system, a three-phase power supply, the computer system coupled to a non-transitory computer-readable recording medium configured to store a program that, when executed, causes the computer system to:
    measuring, by a first voltage measurement unit, a first voltage as a line voltage between a first phase and a second phase of the three-phase power supply;
    measuring, by a first current measurement unit, a first current as a current of the first phase;
    measuring, by a third current measurement unit, a third current as a current of a third phase of the three-phase power supply;
    determining, by a determination unit, a direction of rotation of the first phase, the second phase, and the third phase by comparing one or more electrical characteristics of the first voltage and the first current; and
    computing, by a computation unit, a shift of a phase of the first current based on the direction of rotation to determine a change in a current phase for the first phase, the second phase, and the third phase.

9. A non-transitory computer readable medium configured to store a program executable by a computer system representing a measurement system, the program, when executed, causing the computer system to:
    measuring, by a first voltage measurement unit, a first voltage as a line voltage between a first phase and a second phase of a three-phase power supply;
    measuring, by a first current measurement unit, a first current as a current of the first phase;
    measuring, by a third current measurement unit, a third current as a current of a third phase of the three-phase power supply;
    determining, by a determination unit, a direction of rotation of the first phase, the second phase, and the third phase by comparing one or more electrical characteristics of the first voltage and the first current; and
    computing, by a computation unit, a shift of a phase of the first current based on the direction of rotation to determine a change in a current phase for the first phase, the second phase, and the third phase.

* * * * *